(12) United States Patent
Yang et al.

(10) Patent No.: US 8,153,457 B1
(45) Date of Patent: Apr. 10, 2012

(54) METHOD FOR FORMING LIGHT EMITTING DEVICE

(75) Inventors: Chih-Chung Yang, Taipei (TW);
Cheng-Hung Lin, Taipei (TW);
Chih-Yen Chen, Taipei (TW); Che-Hao Liao, Taipei (TW); Chieh Hsieh, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 13/048,746

(22) Filed: Mar. 15, 2011

(30) Foreign Application Priority Data

Sep. 16, 2010 (TW) ................................ 99131398 A

(51) Int. Cl.
*H01L 21/00* (2006.01)
(52) U.S. Cl. ........................................................ 438/27
(58) Field of Classification Search ...................... 438/27
See application file for complete search history.

(56) References Cited

U.S. PATENT DOCUMENTS

| 2005/0205883 | A1* | 9/2005 | Wierer et al. | .................... | 257/98 |
| 2010/0200880 | A1* | 8/2010 | Sit et al. | .......................... | 257/98 |

* cited by examiner

*Primary Examiner* — A. Sefer
*Assistant Examiner* — Monica D Harrison

(57) ABSTRACT

The invention provides a method for forming a light emitting device. A first substrate is provided. A plurality of patterned masks is formed on the first substrate, or on a semiconductor epitaxial layer grown on the first substrate, or the first substrate is etched to form a plurality of trenches, followed by performing an epitaxial lateral overgrowth process to grow an epitaxy layer over the first substrate. A light emitting structure is formed on the epitaxy layer. A first electrode layer is formed on the light emitting structure. The light emitting structure is wafer bonded to a second substrate. A photoelectrochemical etching process is performed to lift off the first substrate from the epitaxy layer.

20 Claims, 12 Drawing Sheets

METHOD FOR FORMING LIGHT EMITTING DEVICE

BACKGROUND OF THE INVENTION

1. Field of the Invention

This invention generally relates to methods for forming a light emitting device, and more particularly to a technique for lifting-off a sapphire substrate from a light-emitting diode.

2. Description of the Related Art

Semiconductor light-emitting devices have developed rapidly in many applications, for example, general lighting and liquid crystal display backlighting. As such, semiconductor light-emitting devices may replace currently used illumination devices, such as fluorescent lamps or light bulbs. Specifically, GaN based light-emitting diodes represent a main focus in such application developments. FIG. 1 shows the structure of a typical conventional light emitting device, wherein an n-GaN layer 104, quantum wells 106, and a p-GaN layer 108 are sequentially formed on a sapphire substrate 102, and a p-type electrode 110 connects to the p-GaN layer 108, and an n-type electrode 112 connects to the n-GaN layer 104. With the sapphire substrate, which is electrically and thermally insulating, such a light emitting device, however, has the disadvantage of long current path, such that the device resistance is high. Also, the thermally insulating nature of sapphire substrate makes it difficult in removing the generated heat.

Accordingly, a vertical light-emitting diode (VLED) has been developed. As shown in FIG. 2, a vertical light-emitting diode is formed by placing a p-i-n structure (including an n-type GaN layer 204, quantum wells 206 and an p-type GaN layer 208) and a sapphire substrate 202 thereunder upside down, and bonding a p-type electrode 210 (connecting the p-type GaN layer 208) with an electrically and thermally conducting substitution substrate 212. Next, the sapphire substrate 202 is lifted off to expose the n-type GaN layer 204, and the n-type GaN layer 204 is surface-polished for forming an n-type electrode 214 thereon for the fabrication of a light emitting diode with vertically flowing current. Compared to the conventional horizontal light emitting diode, the vertical light emitting diode has the advantages of being able to remove heat more easily and has better current spreading effect. Therefore, a vertical light emitting diode is more suitable to be used as a high power light emitting device. When fabricating a vertical light emitting diode, a substrate lifting-off process is the key technological component. Currently, an ultraviolet laser is used to illuminate the sapphire substrate and scan the light emitting diode structure to lift off the sapphire substrate. Since the material between the sapphire substrate and gallium nitride has a high defect density and strong light absorption, heat generated from laser irradiation can separate the sapphire substrate from the gallium nitride. Although this technique is widely used, it has some drawbacks. For example, laser irradiation may damage the material of the quantum wells in the light emitting diode. Also, semiconductor chips are likely to be broken. Therefore, it is important to develop a novel sapphire substrate lift-off technique for high power light emitting diodes.

BRIEF SUMMARY OF INVENTION

A method for forming a light emitting device is disclosed, comprising providing a first substrate, forming a plurality of patterned masks over the first substrate or etching the first substrate to form a plurality of trenches, growing an epitaxy layer using an epitaxial lateral overgrowth (ELOG) method over the first substrate, forming a light emitting diode structure over the epitaxy layer, and performing a photoelectrochemical etching process to lift off the epitaxy layer from the first substrate.

A method for forming a light emitting device is disclosed, comprising providing a first substrate, forming a semiconductor layer on the first substrate, forming a plurality of patterned masks and at least one light emitting diode element separating mask on the semiconductor layer, using an epitaxial lateral overgrowth (ELOG) method to grow an epitaxy layer on the semiconductor layer, wherein the epitaxy layer laterally grows on the patterned mask layers and the light emitting diode element separating mask, and the epitaxy layer is not coalesced over the light emitting diode element separating mask to isolate the light emitting diode elements, forming a light emitting diode structure on the epitaxy layer, forming a first electrode layer on the light emitting diode structure, bonding the light emitting diode structure to a second substrate, and performing a photoelectrochemical etching process to lift off the epitaxy layer from the first substrate.

BRIEF DESCRIPTION OF DRAWINGS

The invention can be more fully understood by reading the subsequent detailed description and examples with references made to the accompanying drawings, wherein.

DETAILED DESCRIPTION OF INVENTION

It is understood that specific embodiments are provided as examples to teach the broader inventive concept, and one of ordinary skill in the art can easily apply the teaching of the present disclosure to other methods or apparatus. The following discussion is only used to illustrate the invention, not limit the invention.

Figure 1:
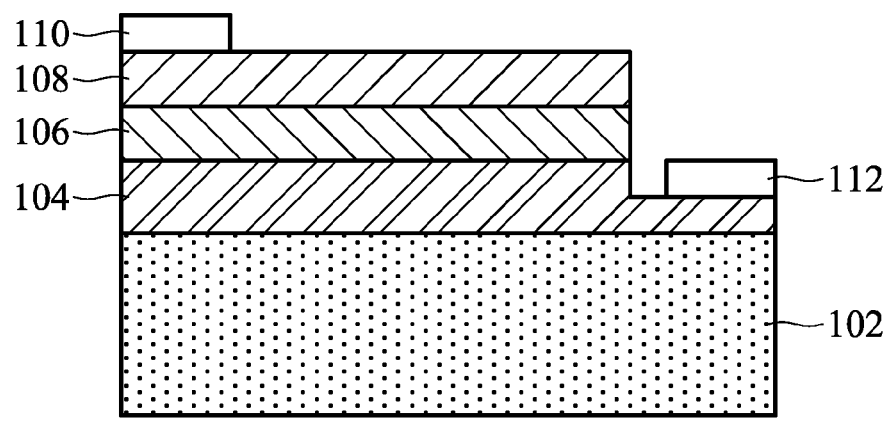
FIG. 1 shows a typical conventional light emitting diode.
Figure 2:
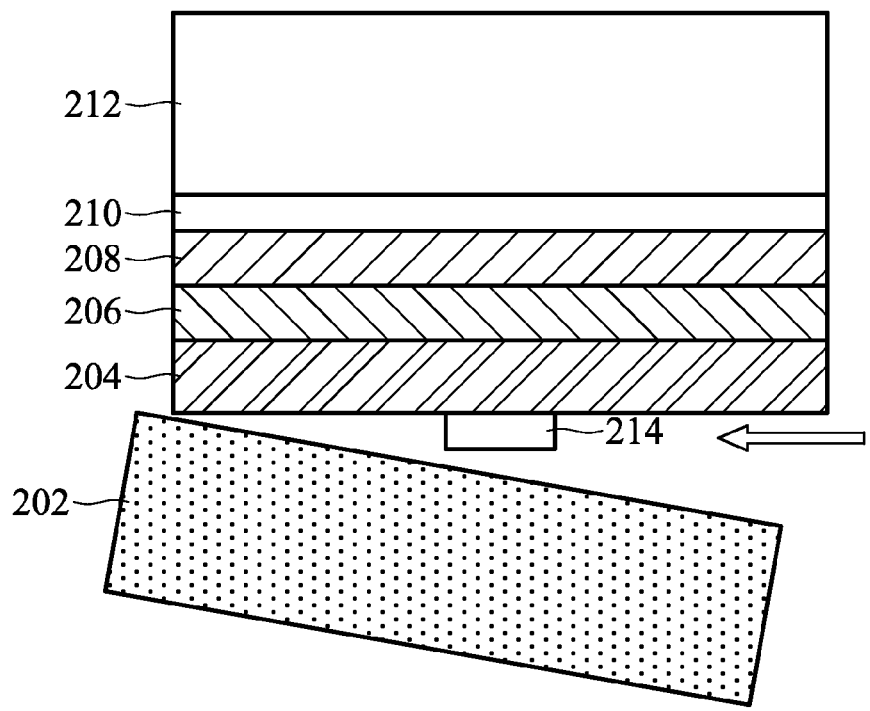
FIG. 2 shows a vertical light-emitting diode.
Figure 3A:
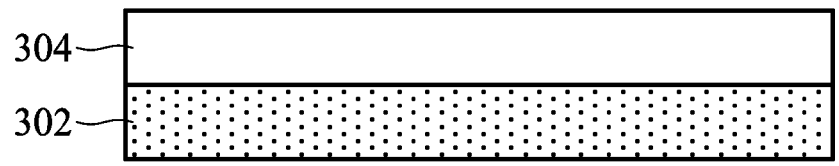
FIGS. 3A~3G show a method for forming a vertical light emitting diode of an embodiment of the invention.
Figure 3B:
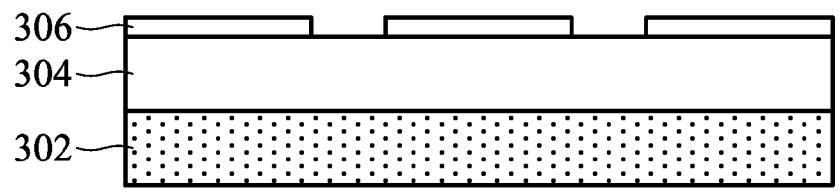

A method for forming a vertical light emitting diode of an embodiment of the invention is illustrated in accordance with FIGS. 3A~3G. First, referring to FIG. 3A, a first substrate 302 such as sapphire substrate is provided. A semiconductor layer 304 is formed on the first substrate 302. In an embodiment of the invention, an undoped GaN layer with thickness of about 400 nm is deposited on the first substrate 302 by metal-organic chemical vapor deposition (MOCVD). Referring to FIG. 3B, a plurality of patterned masks 306 are formed on the undoped GaN layer 304. In an embodiment of the invention, the patterned mask layer 306 is a stripe-shaped silicon oxide layer or silicon nitride layer arranged periodically. In a preferred embodiment of the invention, the patterned masks 306 has the stripe width in the range of 1~20 microns and the window between two adjacent mask stripes in the range of 1~20 microns. The patterned silicon oxide layer (or silicon nitride layer) can be formed by the method as follows. A silicon oxide layer with thickness of about 100 nm is grown on an undoped GaN layer by plasma-enhanced chemical vapor deposition (PECVD). Next, a lithography process is performed to form stripe-shaped resists having a period of 13 µm and width of 5 µm acting as a mask of reactive ion etching (RIE). Thereafter, the silicon oxide layer is etched using the resists as an etching mask to form a stripe-shaped silicon oxide layer having a period of 13 µm and width of 8 µm. In an embodiment of the invention, the patterned silicon oxide layers (or silicon nitride layers) can extend along two directions perpendicular to each other.

Figure 3C:
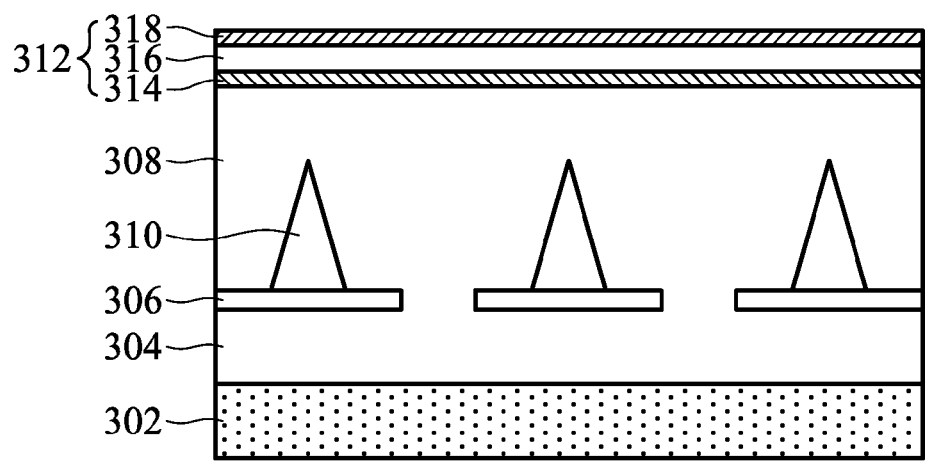

Referring to FIG. 3C, an epitaxy layer 308 is grown on the undoped semiconductor layer 304 and the epitaxy layer 308 specifically laterally extends to be over the patterned mask layer 306. In an embodiment of the invention, the epitaxy layer 308 is undoped GaN formed by the method as follows. A GaN material is grown by metal-organic chemical vapor deposition (MOCVD) with an epitaxial lateral overgrowth (ELOG) method. Since GaN cannot be grown on a silicon oxide layer, it can only be grown on openings in the silicon oxide layer. When the GaN film is grown to be thicker than the silicon oxide layer, it begins to grow laterally, and vertical and lateral growth rates of the GaN film affect the coalescence of the GaN film. Generally, when GaN films are coalesced, a triangle-like seam 310 is formed over each stripe-shaped silicon oxide mask. Next, a light emitting diode structure 312 comprising a first type semiconductor layer 314, a quantum-well structure 316 and a second type semiconductor layer 318 is formed on the epitaxy layer 308. In an embodiment of the invention, the first type semiconductor layer 314 is an n-GaN layer, and the second type semiconductor layer 318 is a p-GaN layer. The quantum-well structure 316 is a multi-layered InGaN/GaN structure.

Figure 3D:
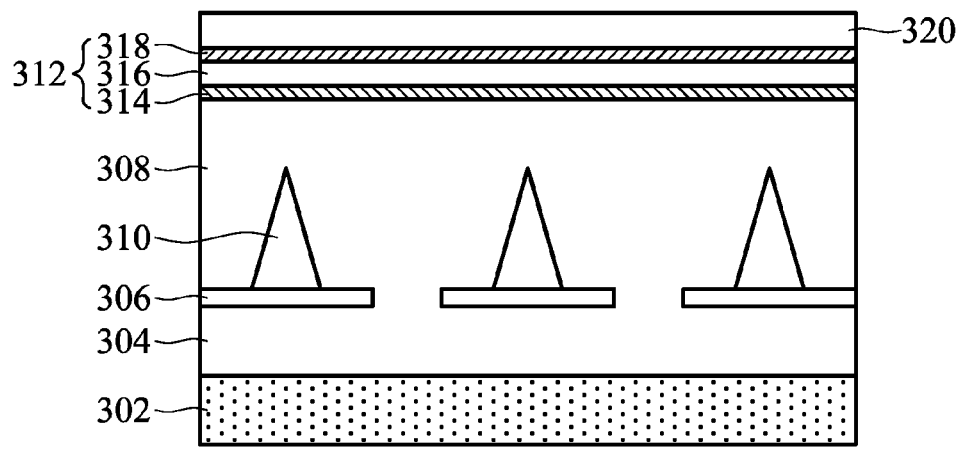
Figure 3E:
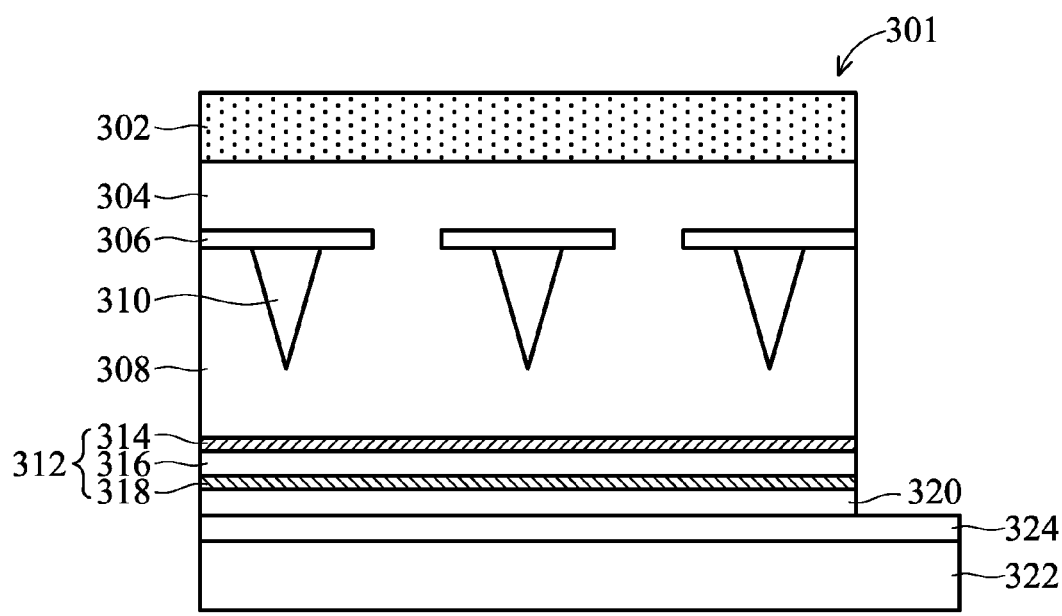

Referring to FIG. 3D, a first electrode layer 320 is formed on the light-emitting structure 312. In an embodiment of the invention, the first electrode layer 320 can be a thick metal layer, such as a Ti/Au layer, formed on the surface of the GaN film by E-gun evaporation. Referring to FIG. 3E, a second substrate 322 with a second metal layer 324 formed thereon is provided. In an embodiment of the invention, the second substrate 322 has good heat and electricity conduction characteristics. For example, the second substrate 322 can be a silicon or copper substrate. The second metal layer 324 is a thick metal layer. As shown in FIG. 3E, the light emitting diode structure 312 and the epitaxy layer 308 are bonded to the second substrate 322 with the first electrode layer 320 bonded to the second metal layer 324 by wafer bonding technology. Therefore, a sample for photoelectrochemical etching (PEC) to lift off a sapphire substrate is prepared.

Figure 3F:
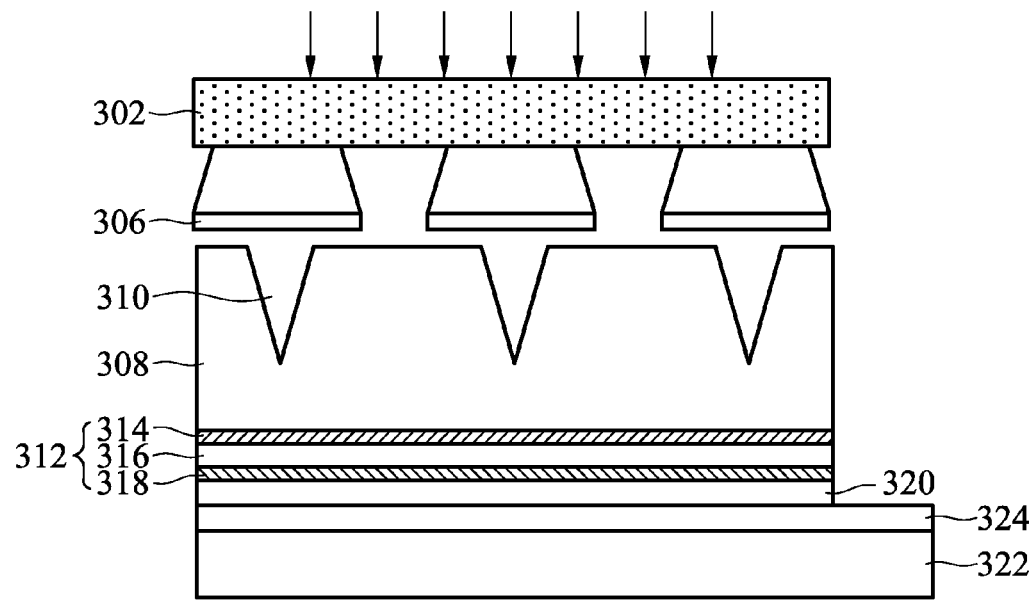
Figure 4:
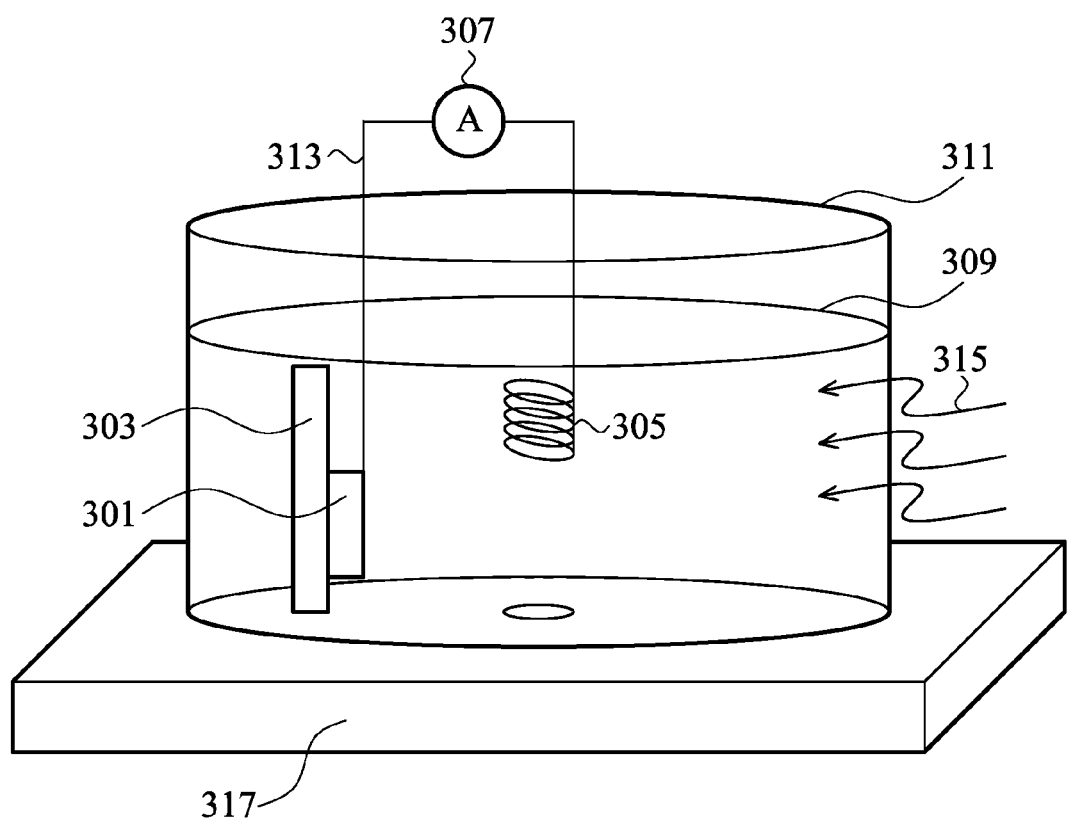
FIG. 4 shows a photoelectrochemical (PEC) etching technique of a sample of the invention.
Figure 5A:
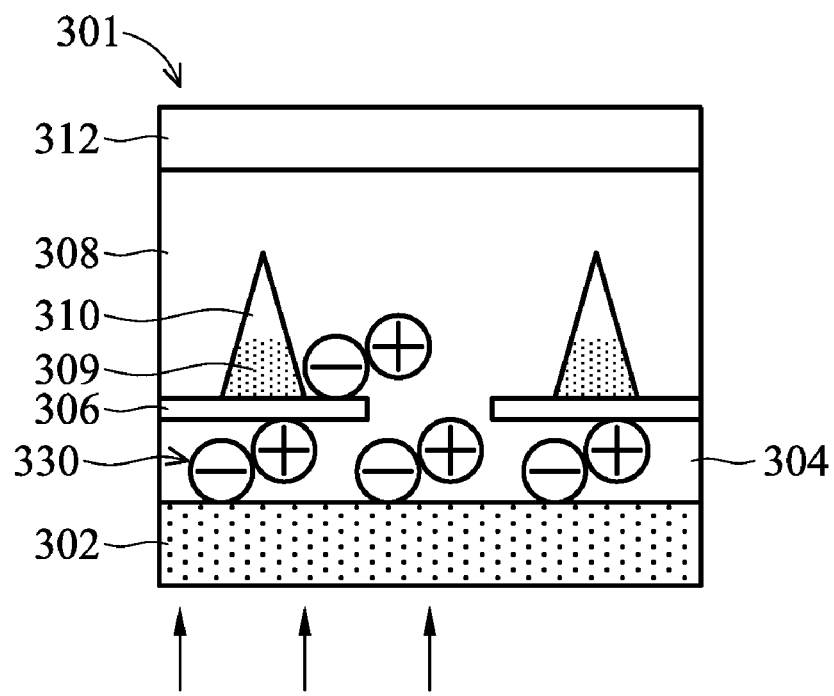
FIGS. 5A~5D show a mechanism for lifting off sapphire substrate using PEC etching.
Figure 5B:
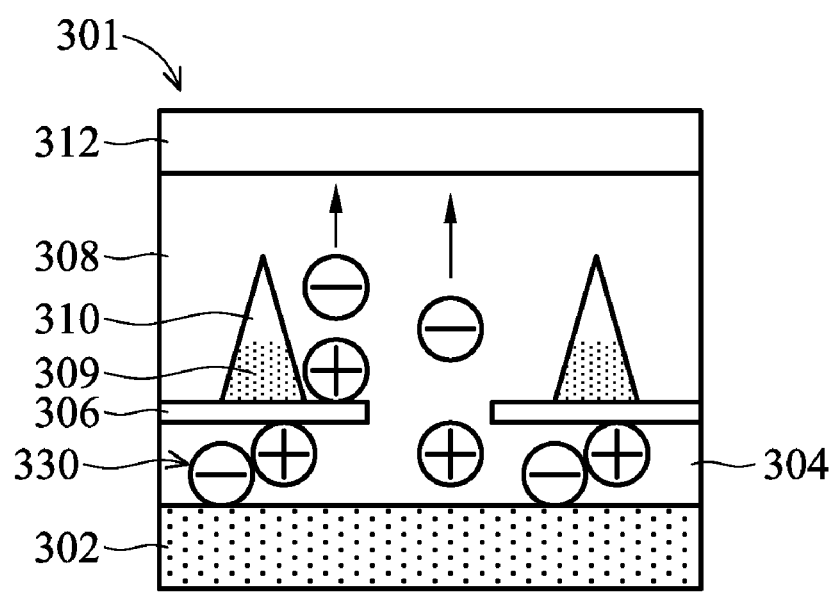
Figure 5C:
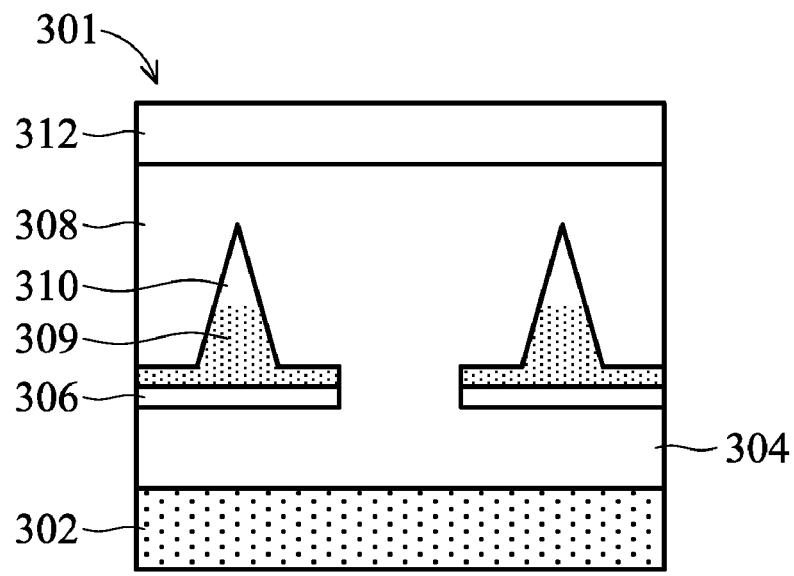
Figure 5D:
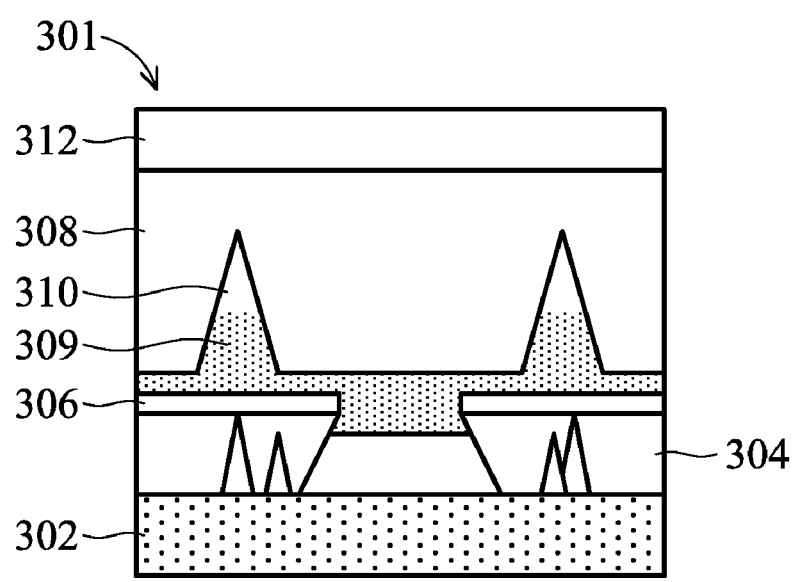

Referring to FIG. 4, the sample 301 is fixed to a support substrate 303 and is immersed in an acid or alkaline electrolyte 309 in a container 311. A platinum coil 305 is disposed in the electrolyte 309 and the sample 301 is connected to the platinum coil 305 through a conductive wire 313, wherein the sample 301 acts as a cathode and the platinum coil 305 acts as an anode. A current meter 307 is interposed between the sample 301 and the platinum coil 305 to observe variations of photocurrent. The first substrate 302 of the sample 301 is irradiated by a light source 315, such as a high power (800 W) Xe lamp. The light used in photoelectrochemical (PEC) etching in an embodiment of the invention can be ultraviolet light, and the diameter of the light can be controlled to be between 1 mm and 8 cm. An embodiment of the invention can irradiate an entire surface of the sample or two-dimensionally scan the sample to lift off the substrate. In an embodiment of the invention, the wavelength of the light spectrum is between 200 nm to 380 nm. Therefore, photoelectrochemical etching begins to etch a portion of GaN which contacts the KOH electrolyte solution 309 when illuminated by light. After conducting PEC etching for a period of time, as shown in FIG. 3F, the portion of the epitaxy layer 308 grown by the ELOG method can be lifted off from the first substrate 302 such as a sapphire substrate. The mechanism for lifting off the sapphire substrate using PEC etching is illustrated in accordance with FIG. 5A~FIG. 5D. First, referring to FIG. 5A, a sample 301 is placed into a KOH solution 309. The KOH solution 309 permeates seams 310 over the pattern mask layer 306 in the GaN formed by the ELOG method. To enhance electrolyte permeation into the seams, the electrolyte container 311 is placed on an ultrasonic vibrator 317, as shown in FIG. 4. When the sample 301 is irradiated with light, the electron/hole pairs 330 are generated in the semiconductor layer 304 and a portion of the epitaxy layer 308. The arrangement of the electron/hole pairs depends upon the depth of the ultraviolet light penetrating the GaN. For example, GaN substantially has an absorption coefficient of ~1×10$^5$ cm$^{-1}$ to light having a wavelength of 350 nm. Therefore, it can be estimated that the electron/hole pairs can be generated to the depth of 450 nm in the GaN layer over the sapphire substrate. Referring to FIG. 5B, since a portion of the GaN is covered by the patterned mask 306, the electron/hole pairs 330 are easily recombined in that portion of the GaN. On the contrary, the electron/hole pairs 330 over the patterned mask 306 and in the opening between the adjacent patterned masks 306 can be easily separated. Referring to FIG. 5C, the holes in the epitaxy layer 308 enhances the GaN to react with the KOH solution 309 to form $Ga_2O_3$. $Ga_2O_3$ is then etched by the KOH solution 309. Therefore, the KOH solution 309 can permeate into the region between the patterned mask 306 and the epitaxy layer 308. Next, the portion of the GaN in the opening between the adjacent patterned masks 306 is etched and removed by the KOH solution 309. Therefore, as shown in FIG. 5D and FIG. 3F, the epitaxy layer 308 and the first substrate 302 can be separated.

Figure 3G:
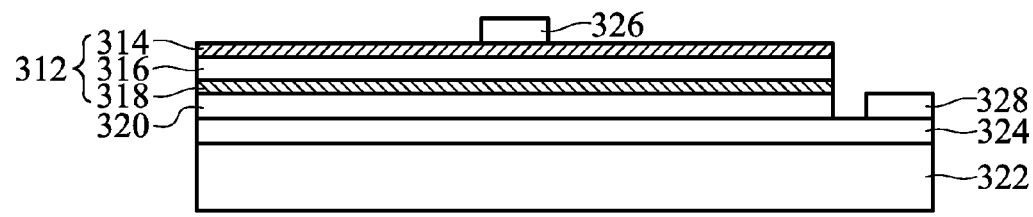

Refer to FIG. 3G, wherein a polishing or etching process to remove the unnecessary epitaxy layer 308 and expose the light emitting diode structure 312 is performed. An n-type electrode pad 326 is formed on the light emitting diode structure 312, and a p-type electrode pad 328 is formed on the second metal layer 324. Therefore, a vertical type light emitting diode of an embodiment is completed. The epitaxy layer of the embodiment using the ELOG method and photoelectrochemical etching to lift off sapphire substrate has the advantages as follows. First, the KOH solution used in the photoelectrochemical etching can permeate into the seams of the epitaxy layer formed by the ELOG method. Therefore, the method of the embodiment can be used to lift off the sapphire substrate from the epitaxy layer with a large area. Second, the method of the embodiment can reduce the process time for lifting off the sapphire substrate using photoelectrochemical etching. Third, the method of the embodiment using the photoelectrochemical etching process to lift off the sapphire substrate should not cause damage to the semiconductor epitaxy layer. Therefore, yield of lifting off the substrate can be increased.

Figure 6A:
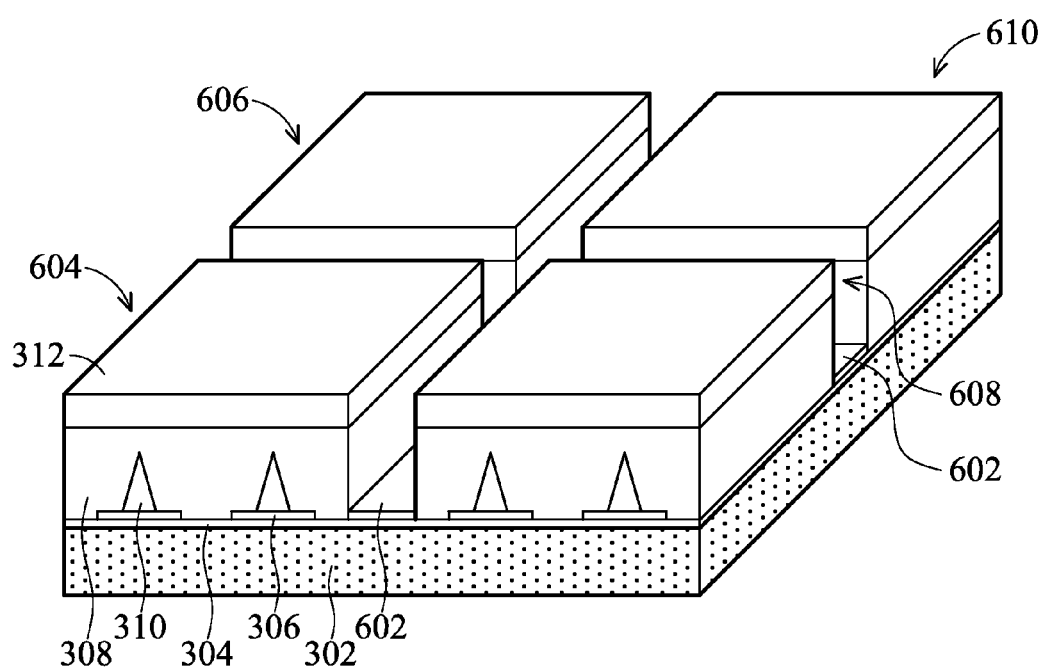
FIGS. 6A and 6B show a method for forming a vertical light emitting diode of another embodiment of the invention.
Figure 6B:
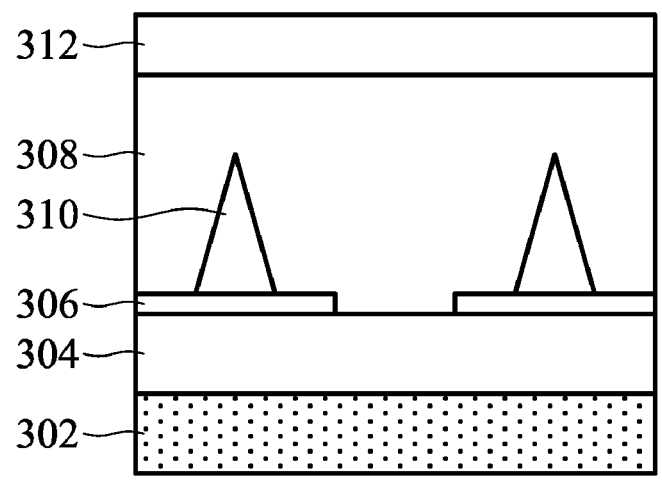

FIGS. 6A and 6B show the fabrication of a light emitting diode device of another embodiment of the invention. For simplicity, the like elements between FIGS. 6A~6B and FIGS. 3A~3G use the same reference numbers. Referring to FIG. 6A, a first substrate 302, such as sapphire substrate is provided. A semiconductor layer 304 is formed on the first substrate 302. In an example, the semiconductor layer 304 is undoped GaN. Next, an important step of the embodiment is conducted. Pattern mask layers 306 and light emitting diode element separating masks 602 are formed on the semiconductor layer 304. The pattern mask layers 306 and light emitting diode element separating masks 602 can be made of silicon oxide and can be formed in the same process step. It is noted that the width of the light emitting diode element separating mask 602 is greater than the width of the pattern mask layer 306. Therefore, the light emitting diode element separating masks 602 can be used to define the light emitting diode elements 604, 606, 608 and 610. In a preferred embodiment of the invention, the patterned masks 306 and the light emitting diode element separating masks 602 are stripe-shaped silicon oxide, silicon nitride or other dielectric layers, with the patterned mask stripe width in the range of 1~20 microns and the window between two adjacent patterned mask stripes in the range of 1~20 microns, and with the light emitting diode element separating mask stripe width in the range of 20~100 microns. Next, an epitaxy layer 308 is formed on the semiconductor layer 304, wherein the epitaxy layer 308 laterally extends over the patterned mask layers 306. In an embodiment of the invention, the epitaxy layer 308 is grown by metal-organic chemical vapor deposition (MOCVD) with the epitaxial lateral overgrowth (ELOG) method. Since GaN cannot be grown on a silicon oxide layer, it can only be grown on openings in the silicon oxide layer. When the GaN film is grown to become thicker than the silicon oxide layer, it begin to grow laterally, and vertical and lateral growth rate of the GaN film affects the coalescence of the GaN film. Generally, when the GaN films are coalesced, a triangle-like seam 310 is formed over each patterned mask 306, as shown in FIG. 6B. Since the light emitting diode element separating mask 602 has a greater width, the epitaxy layer 308 is not coalesced over the light emitting diode element separating masks 602. Therefore, the light emitting diode elements 604, 606, 608 and 610 can be defined. Next, a light emitting diode structure 312 comprising a first type semiconductor layer, a quantum-well structure and a second type semiconductor layer is formed on the epitaxy layer 308. The following step using a photoelectrochemical etching process to lift off the sapphire substrate 302 is similar to the embodiment illustrated in FIGS. 3E~3G and is not described again herein. The embodiment using the light emitting diode element separating mask 602 to define the light emitting diode elements 604, 606, 608 and 610 has advantages as follows. First, the light emitting diode element separating masks for isolating the light emitting diode elements can be formed simultaneously as formation of the patterned masks for the ELOG process. Second, the embodiment can omit steps of patterning and etching a semiconductor layer for isolating the light emitting diode elements to reduce process time and cost. Third, since the semiconductor layer is not coalesced over the light emitting diode element separating masks, electrolytes, such as KOH, can flow into the seams more easily. Therefore, etching rate of photoelectrochemical etching is increased.

Figure 6C:
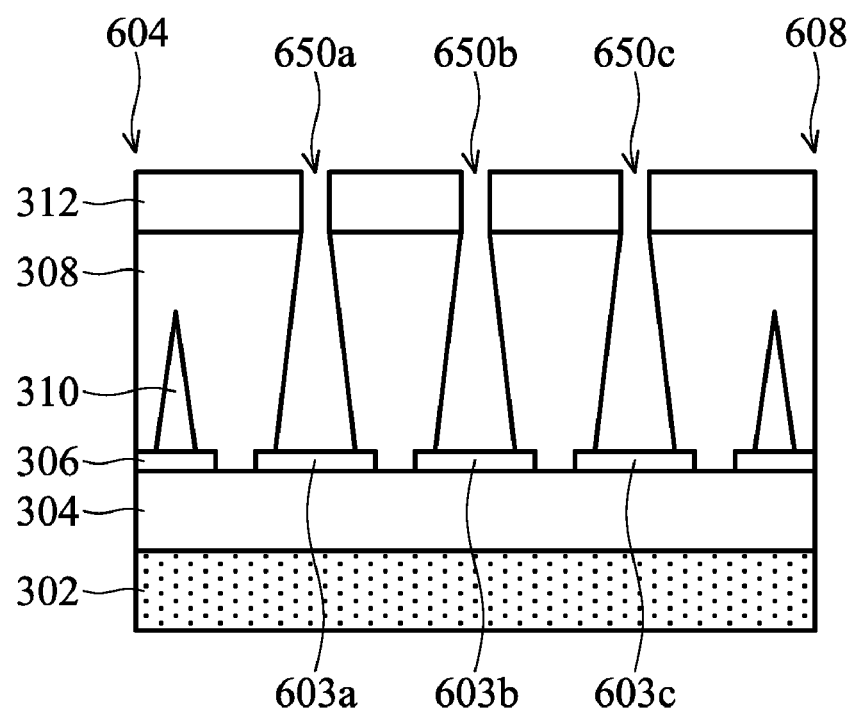
FIG. 6C shows a light emitting diode device of a further embodiment of the invention.

FIG. 6C shows a light emitting diode device of a further embodiment of the invention. For simplicity, the like elements between FIG. 6C and FIG. 6A use the same reference numbers. In order to avoid generating bumps at edges of the epitaxy layers of the light emitting diode elements 604, 606, 608 and 610 in FIG. 6A due to too great a space between the adjacent light emitting diode elements, as shown in FIG. 6C, the embodiment places a plurality of separating masks 603a, 603b and 603c between the adjacent light emitting diode elements 604, 608 and the epitaxy layer 308 is not coalesced over the separating masks 603a, 603b and 603c. Therefore, the light emitting diode elements 604, 608 can be isolated by the seams 650a, 650b and 650c over the separating masks 603a, 603b and 603c, and the issue of generating bumps at edges due to too great a space between the adjacent light emitting diode elements 604, 608 can be eliminated.

Figure 7A:
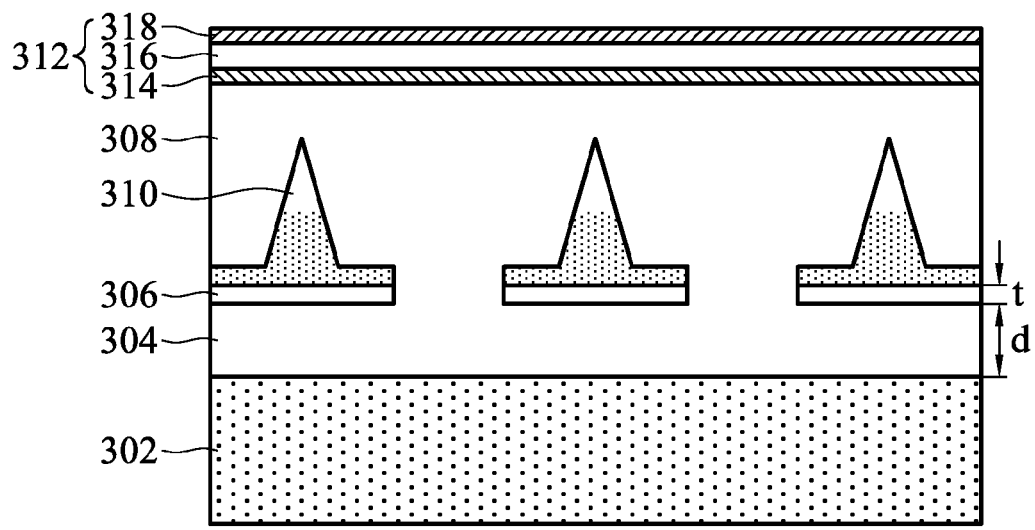
FIG. 7A shows a cross section of an intermediate stage of a method for forming a vertical light emitting diode of further another embodiment of the invention.

The conditions of fabricating a light emitting diode of an embodiment of the invention are discussed in accordance with FIG. 7A. Referring to FIG. 7A, a substrate, such as sapphire substrate is provided. A semiconductor layer 304 is formed on the first substrate 302. In an example, the semiconductor layer 304 is undoped GaN. An epitaxy layer 308 is grown on the semiconductor layer and the epitaxy layer specifically laterally extends to be over the patterned masks 306. In an embodiment of the invention, the epitaxy layer 308 is undoped GaN formed by the method as follows. A GaN material is grown by metal-organic chemical vapor deposition (MOCVD) with the epitaxial lateral overgrowth (ELOG) method. Since GaN cannot be grown on a silicon oxide layer, it can only be grown on openings in the silicon oxide layer. When the GaN film is grown to become thicker than the silicon oxide layer, it begins to grow laterally, and vertical and lateral growth rates of the GaN film affect coalescence of the GaN film. Generally, when the GaN film is coalesced, a triangle-like seam 310 is formed over each strip-shaped silicon oxide mask.

It is noted that the semiconductor layer 304 and the patterned mask layer 306 are specifically limited to a specific thickness range. In the embodiment, thickness d of the semiconductor layer 304 can be 0~800 nm, and thickness t of the patterned mask layer 306 can be 30~800 nm.

Figure 7B:
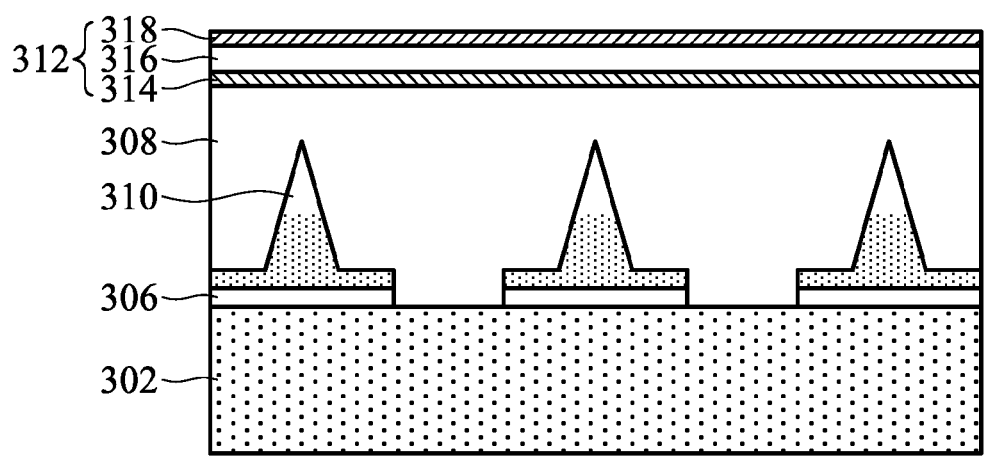
FIG. 7B shows a cross section of an intermediate stage of a method for forming a vertical light emitting diode of yet another embodiment of the invention.

FIG. 7B shows an example of FIG. 7A when thickness d of the semiconductor layer 304 is zero. As shown in FIG. 7B, since thickness d of the semiconductor layer 304 is zero, the patterned masks 306 are directly formed on the first substrate 302. An epitaxy layer 308 is grown on the first substrate 302 and the epitaxy layer 308 specifically laterally extends to be over the patterned masks 306. Since GaN cannot be grown on the pattern mask 306 such as silicon oxide, it can only be grown on openings of the patterned masks 306. When the GaN film is grown to become thicker than the patterned mask 306, it begins to grow laterally. Generally, when the GaN film is coalesced, a triangle-like seam 310 is formed over each stripe-shaped patterned mask 306. Next, a light emitting diode structure 312 comprising a first type semiconductor layer 314, a quantum-well structure 316 and a second type semiconductor layer 318 is formed on the epitaxy layer 308. The following steps using a photoelectrochemical etching process to lift off the sapphire substrate 302 is similar to the embodiment illustrated in FIGS. 3E~3G and is not described again herein.

A method for forming a light emitting diode device of an embodiment of the invention is illustrated in accordance with FIGS. 8A~8D. First, referring to FIG. 8A, a substrate 802 such as sapphire substrate is provided. Next, a plurality of one-dimensional or two-dimensional arranged trenches 808 is formed on the substrate 802. It is noted that the trenches 808 are preferably connected to opposite ends of the substrate 802, such that electrolytes can flow into the trenches 808 in the following steps. For example, the ends can be the first end 804 and the second end 806 shown in FIG. 9. Specifically, the trenches 808 are required to have enough width and height for the electrolyte to flow into a central portion of the substrate 802. In an embodiment of the invention, the width of the trenches 808 is 0.5~10 microns, and the depth of the trenches 808 is 0.1~5 microns.

Figure 8A:
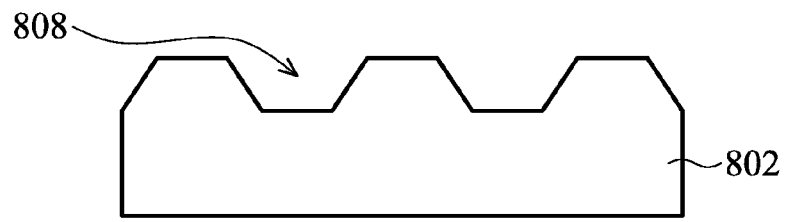
FIGS. 8A~8C show cross sections of intermediate stages of a method for forming a vertical light emitting diode of further another embodiment of the invention.
Figure 8B:
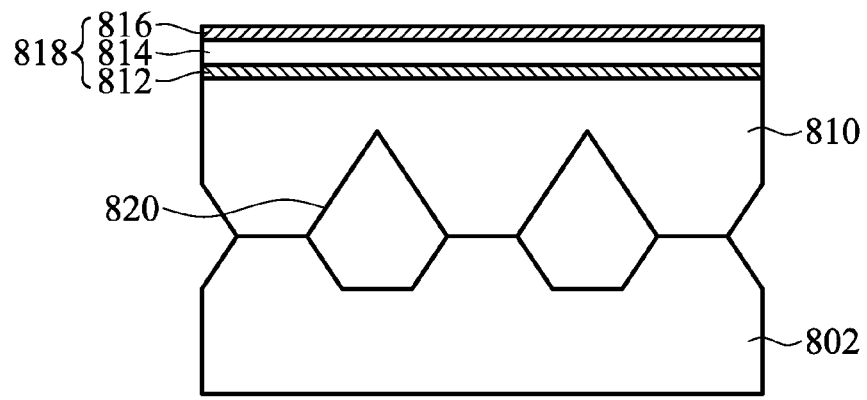
Figure 9:
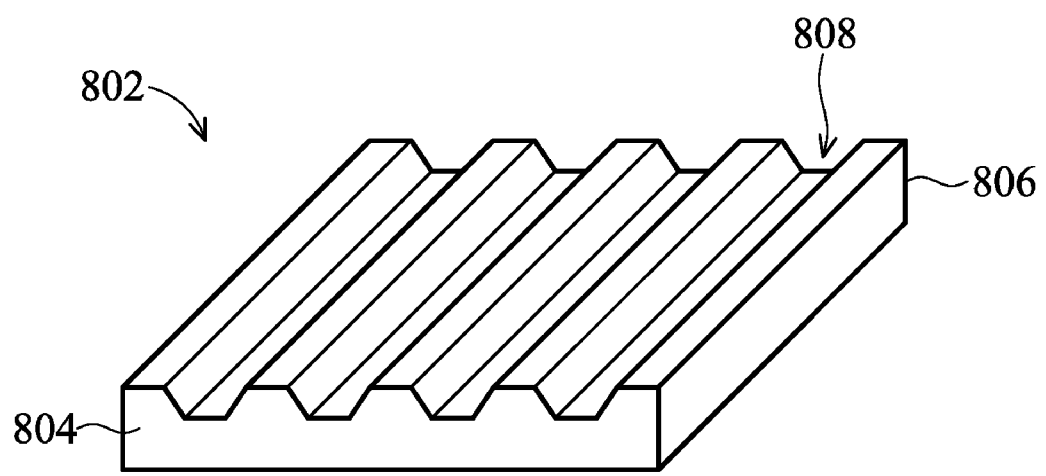
FIG. 9 shows a three dimensional diagram of a substrate having trenches.

Referring to FIG. 8B, an epitaxy layer 810 is grown on the substrate 802. In an embodiment of the invention, the epitaxy layer 810 is undoped GaN formed by metal-organic chemical vapor deposition (MOCVD). It is noted that the epitaxy layer 810 cannot be grown over the trenches 808. The epitaxy layer 810 can only be grown on a surface of the substrate 802 out of the trenches 808, and the epitaxy layer 810 further extends laterally to be over the trenches 808. Generally, when the GaN film is coalesced, a triangle-like seam 820 is formed over each trench 808. Next, a light emitting diode structure 818 comprising a first type semiconductor layer 812, a quantum-well structure 814 and a second type semiconductor layer 816 is formed on the epitaxy layer 810. In an embodiment of the invention, the first type semiconductor layer 812 is an n-GaN layer, and the second type semiconductor layer 816 is a p-GaN layer. The quantum-well structure 814 is a multi-layered InGaN/GaN structure.

Figure 8C:
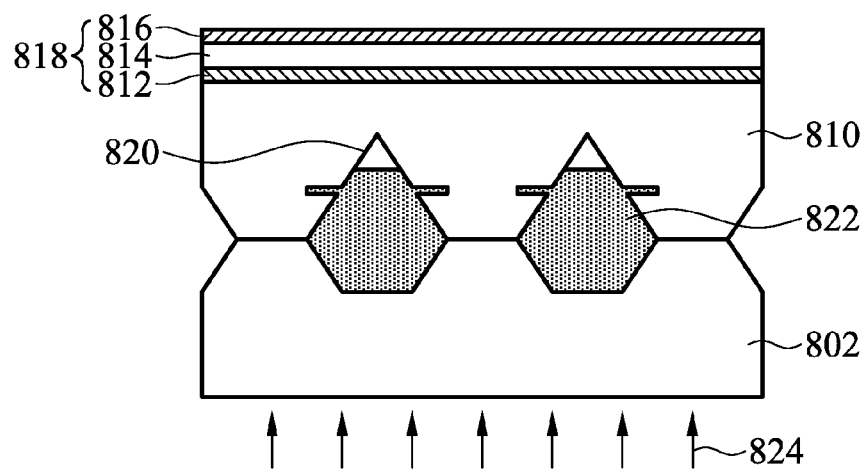

Referring to FIG. 8C, the substrate 802 is immersed in an electrolyte 822. The electrolyte 822 flows into the seams 820 between the substrate 802 and the epitaxy layer 810, and the epitaxy layer 810 is irradiated by light 824 from the substrate 802 side using photoelectrochemical etching (PEC) to lift off the substrate 802. It is noted that a portion of the epitaxy layer 810 neighboring an interface between the epitaxy layer 810 and the substrate 802 has poor quality and includes many defects. Therefore, the embodiment preferably adjusts parameters for the photoelectrochemical etching process to occur at the position at a distance separating from the interface between the epitaxy layer 810 and the substrate 802. Consequently, the step of lifting off the substrate 802 can simultaneously remove the portion of the epitaxy layer 810 having poor quality. The following step using a photoelectrochemical etching process to lift off the sapphire substrate is similar to the embodiment illustrated in FIGS. 3E~3G and is not described again herein.

According to the principles of the embodiment, the light emitting diode element separating masks can be replaced by the trenches having great enough height and width. Therefore, the trenches can act as isolations of light emitting diode elements.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a light emitting device, comprising:
    providing a first substrate;
    forming a plurality of patterned masks over the first substrate or etching the first substrate to form a plurality of trenches;
    growing an epitaxy layer using an epitaxial lateral overgrowth (ELOG) method over the first substrate with the patterned masks;
    forming a light emitting diode structure over the epitaxy layer;
    forming a first electrode layer on the light emitting diode structure;
    bonding the light emitting diode structure to a second substrate; and
    performing a photoelectrochemical etching process to lift off the epitaxy layer from the first substrate.

2. The method for forming a light emitting device as claimed in claim 1, wherein the first substrate is a sapphire substrate.

3. The method for forming a light emitting device as claimed in claim 1, further comprising forming a semiconductor layer on the first substrate before forming a plurality of patterned masks, wherein the semiconductor layer is GaN.

4. The method for forming a light emitting device as claimed in claim 3, wherein the thickness of the semiconductor layer on the first substrate is 0~800 nanometer.

5. The method for forming a light emitting device as claimed in claim 3, wherein the patterned masks are stripe-shaped silicon oxide, silicon nitride or other dielectric layers, with the stripe width in the range of 1~20 microns and the window between two adjacent mask stripes in the range of 1~20 microns, arranged along one direction or two perpendicular directions to spread over the entire surface of the first substrate or the semiconductor layer.

6. The method for forming a light emitting device as claimed in claim 1, wherein the epitaxy layer extends laterally to be over the patterned masks or the trenches on the first substrate.

7. The method for forming a light emitting device as claimed in claim 6, wherein the epitaxy forms a triangle-like seam over each patterned mask or trench.

8. The method for forming a light emitting device as claimed in claim 7, wherein alkaline or acid electrolyte permeates the triangle-like seams to etch portions of the epitaxy layer over the patterned masks or between the adjacent patterned masks that is accelerated by placing the electrolyte container on an ultrasonic vibrator.

9. The method for forming a light emitting device as claimed in claim 1, wherein the light emitting diode structure comprises a first type semiconductor layer, a quantum well structure and a second type semiconductor layer.

10. The method for forming a light emitting device as claimed in claim 1, further comprising performing a polishing or etching process which removes the epitaxy layer to expose the light emitting diode structure.

11. The method for forming a light emitting device as claimed in claim 1, wherein the epitaxy layer is undoped GaN.

12. The method for forming a light emitting device as claimed in claim 1, wherein the trenches have a width of 0.5~10 microns, and a depth of 0.1~5 microns.

13. The method for forming a light emitting device as claimed in claim 1, wherein the patterned masks have a thickness of 30 nm~800 nm.

14. A method for forming a light emitting device, comprising:
    providing a first substrate;
    forming a semiconductor layer on the first substrate;
    forming a plurality of patterned masks and at least one light emitting diode element separating mask on the semiconductor layer;
    using an epitaxial lateral overgrowth (ELOG) method to grow an epitaxy layer on the semiconductor layer, wherein the epitaxy layer laterally grows on the patterned masks and the light emitting diode element separating masks, and the epitaxy layer is not coalesced over the light emitting diode element separating masks to isolate the light emitting diode elements;

forming a light emitting diode structure on the epitaxy layer;

forming a first electrode layer on the light emitting diode structure;

bonding the light emitting diode structure to a second substrate; and performing a photoelectrochemical etching process to lift off the epitaxy layer from the first substrate.

15. The method for forming a light emitting device as claimed in claim 14, wherein the patterned masks and the light emitting diode element separating masks are stripe-shaped silicon oxide, silicon nitride or other dielectric layers, with the patterned mask stripe width in the range of 1~20 microns and the window between two adjacent patterned mask stripes in the range of 1~20 microns, and with the light emitting diode element separating mask stripe width in the range of 20~100 microns.

16. The method for forming a light emitting device as claimed in claim 14, wherein the width of the light emitting diode element separating mask is greater than the width of each of the patterned masks.

17. The method for forming a light emitting device as claimed in claim 14, wherein the first substrate is a sapphire substrate.

18. The method for forming a light emitting device as claimed in claim 14, further comprising a polishing or etching process which removes the epitaxy layer to expose the light emitting diode structure.

19. The method for forming a light emitting device as claimed in claim 14, wherein the patterned masks and at least one light emitting diode element separating mask are directly formed on the first substrate without the semiconductor layer therebetween.

20. The method for forming a light emitting device as claimed in claim 14, further comprising forming the first trenches and at least a second trench to replace the patterned masks and the light emitting diode element separating mask.

* * * * *